US011188151B2

(12) United States Patent
Bushnell et al.

(10) Patent No.: US 11,188,151 B2
(45) Date of Patent: Nov. 30, 2021

(54) VIBRATION DRIVEN HOUSING COMPONENT FOR AUDIO REPRODUCTION, HAPTIC FEEDBACK, AND FORCE SENSING

(71) Applicant: Apple Inc., Cupertino, CA (US)

(72) Inventors: Tyler S. Bushnell, Mountain View, CA (US); Justin D. Crosby, Cupertino, CA (US); Kevin Truong, Markham (CA); Nikolas T. Vitt, Sunnyvale, CA (US); Daniel Corona, Austin, TX (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 16/292,927

(22) Filed: Mar. 5, 2019

(65) Prior Publication Data
US 2020/0097086 A1  Mar. 26, 2020

Related U.S. Application Data

(60) Provisional application No. 62/736,095, filed on Sep. 25, 2018.

(51) Int. Cl.
| | |
|---|---|
| *G06F 3/01* | (2006.01) |
| *B06B 1/06* | (2006.01) |
| *G01L 1/16* | (2006.01) |
| *H01L 41/09* | (2006.01) |
| *H04R 9/02* | (2006.01) |

(52) U.S. Cl.
CPC ............... *G06F 3/016* (2013.01); *B06B 1/06* (2013.01); *G01L 1/16* (2013.01); *H01L 41/09* (2013.01); *H04R 9/025* (2013.01); *H04R 2499/15* (2013.01)

(58) Field of Classification Search
None
See application file for complete search history.

(56) References Cited

U.S. PATENT DOCUMENTS

| 7,151,837 B2 | 12/2006 | Bank et al. |
| 9,913,045 B2 | 3/2018 | Hooton et al. |
| (Continued) | | |

FOREIGN PATENT DOCUMENTS

| CN | 101763192 | 6/2010 |

OTHER PUBLICATIONS

China Patent Application No. CN201910177918.6, Office Action, dated Sep. 17, 2021, 17 pages.

*Primary Examiner* — Krishna P Neupane
(74) *Attorney, Agent, or Firm* — Kilpatrick Townsend & Stockton LLP

(57) ABSTRACT

A portable electronic device is described in this disclosure. The portable electronic device can take many forms including for example a smart watch, a smart phone, or a tablet computing device. The portable electronic device can include a device housing component; and a display assembly coupled to the device housing component. The display assembly includes a protective cover that shields a display component from damage. The portable electronic device also includes an actuator configured to apply a vibratory input to the display assembly. In some embodiments, the actuator contacts both the device housing component and the protective cover of the display assembly. In some embodiments, the actuator is affixed only to an interior-facing surface of the display component.

19 Claims, 7 Drawing Sheets

(56) References Cited

U.S. PATENT DOCUMENTS

| | | | | |
|---|---|---|---|---|
| 2010/0156818 | A1* | 6/2010 | Burrough | G06F 3/016 |
| | | | | 345/173 |
| 2010/0253485 | A1* | 10/2010 | Park | G06F 3/041 |
| | | | | 340/407.2 |
| 2011/0102343 | A1* | 5/2011 | Imai | G06F 1/1643 |
| | | | | 345/173 |
| 2013/0207793 | A1* | 8/2013 | Weaber | G08B 6/00 |
| | | | | 340/407.2 |
| 2015/0145657 | A1* | 5/2015 | Levesque | G06F 3/016 |
| | | | | 340/407.2 |
| 2016/0058375 | A1* | 3/2016 | Rothkopf | A61B 5/0205 |
| | | | | 600/301 |
| 2017/0086743 | A1* | 3/2017 | Bushnell | A61B 5/6843 |
| 2017/0177160 | A1* | 6/2017 | Oh | G06F 3/045 |
| 2017/0285748 | A1 | 10/2017 | Evans et al. | |
| 2018/0356926 | A1* | 12/2018 | Park | G06F 3/016 |
| 2019/0101988 | A1* | 4/2019 | Kang | G06F 3/0416 |

\* cited by examiner

VIBRATION DRIVEN HOUSING COMPONENT FOR AUDIO REPRODUCTION, HAPTIC FEEDBACK, AND FORCE SENSING

CROSS REFERENCES TO RELATED APPLICATIONS

This application claims priority to U.S. Provisional Patent Application No. 62/736,095, filed Sep. 25, 2018, the disclosure of which is herein incorporated by reference in its entirety and for all purposes.

FIELD

The described embodiments relates generally to driving an enclosure component to generate audio waves or haptic feedback. In particular, the housing component is the display assembly.

BACKGROUND

Wearable electronic devices such as smart watches can have very small form factors that can limit the size of a speaker. For this reason, audio output is sometimes limited entirely to headphones or wireless connections to other devices with larger speakers. Wearable devices that do include a speaker often fail to cover a desired range of frequencies. For this reason, ways of improving audio output for wearable and even portable electronic devices in general are desirable.

SUMMARY

This disclosure describes various ways to generate audio waves or haptic feedback by vibrating a display assembly of a portable electronic device.

A portable electronic device is disclosed and includes the following: a device housing component having a lip defining a front opening; a display assembly covering the front opening and cooperating with the device housing component to define an interior volume, the display assembly comprising: a protective cover having a central region and a peripheral region; and a display coupled to the central region; and a piezoelectric actuator coupled to the peripheral region and to the lip of the device housing component, the piezoelectric actuator being configured to apply a vibratory input to the protective cover.

A portable electronic device is disclosed and includes the following: a device housing component; a display assembly coupled to the device housing component, the display assembly having a protective cover; and an actuator configured to apply a vibratory input to the display assembly, the actuator contacting both the device housing component and the protective cover of the display assembly.

Another portable electronic device is disclosed and includes the following a device housing component; a display assembly coupled to the device housing component, the display assembly comprising a protective cover; and an array of piezoelectric actuators coupled to an interior facing surface of the display assembly and being configured to apply a vibratory input to the display assembly.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
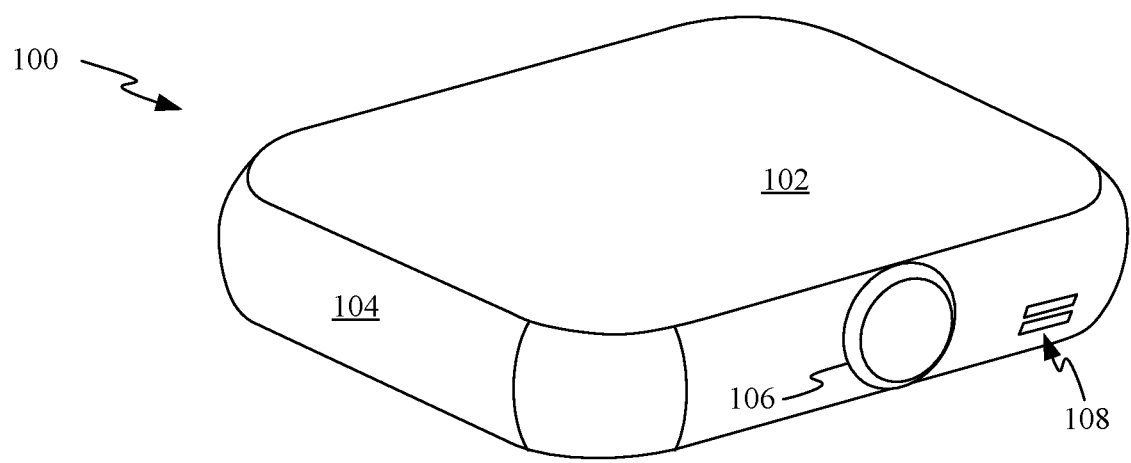
FIG. 1 shows a perspective view of a wearable electronic device suitable for use with the described embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Small form factor portable electronic devices can struggle to output audio waves having a desired volume and frequency spectrum. The audio output quality tends to be limited by the size of the speaker, which can be highly constrained in small form factor portable electronic devices such as wearable devices. This can be problematic when the device is used for voice applications or music playback. One solution to this problem is to apply vibratory motion to a device housing component to produce audio waves or augment audio waves being produced by a low power dedicated audio transducer. Applying vibratory motion to a housing component having a large and relatively flat exterior surface such as a display assembly can result in generating audio waves with increased volume and/or quality when compared to a much small speaker assembly that fits within a device housing of the small form factor portable electronic device.

Vibration of the display assembly can be accomplished in numerous ways including by one or more piezoelectric actuators. The piezoelectric actuators can be arranged around a periphery of the display assembly or adhered directly to an interior-facing surface of the display assembly. Applying current to the piezoelectric actuators results in expansion and contraction of the piezoelectric actuators. The expansion and contraction of the piezoelectric actuators yields a vibratory input being received by the display component. In addition to generating acoustic output, piezoelectric actuators can also be operative as force sensors. When a user applies a force to the display assembly a portion of this force is then transferred to the piezoelectric actuators. Forces received by piezoelectric actuators are converted to voltages, which can then be used as sensor inputs to characterize an amount of force received from a user input.

A voice coil motor can also be utilized to induce vibration in the display assembly. For example, an electrically conductive coil can be coupled to the display assembly and a permanent magnet can be positioned within the small form factor device. Applying a varying current to the electromagnetic coil generates a magnetic field that interacts with a magnetic field emitted by the permanent magnet to induce motion of the display assembly. In some embodiments, the electromagnetic coil can take the form of a loop running along a periphery of the display assembly.

These and other embodiments are discussed below with reference to FIGS. 1-6; however, those skilled in the art will readily appreciate that the detailed description given herein with respect to these figures is for explanatory purposes only and should not be construed as limiting.

FIG. 1 shows a perspective view of a wearable electronic device 100 suitable for use with the described embodiments. Wearable device 100 includes a touch sensitive display assembly 102 configured to display a graphical user interface to a user of wearable device 100. Wearable device 100 also includes housing component 104. Housing component 104 can be formed of high strength materials such as stainless steel, ceramic or aluminum. Housing component 104 cooperates with display assembly 102 in order to enclose multiple electrical components along the lines of sensors, printed circuit boards, processors and the like. Wearable electronic device 100 also includes more conventional user interface components such as crown 106, which can help facilitate the scrolling of lists across the graphical user interface presented by display assembly 102. In some embodiments, wearable electronic device 100 can also include speaker vents 108 defined by device housing component 104 through which a dedicated speaker assembly disposed within wearable electronic device 100 projects audio waves. While not depicted herein, device housing component 104 can also include lugs for attaching wearable electronic device 100 to straps for affixing wearable electronic device 100 to the wrist of a user.

Figure 2A:
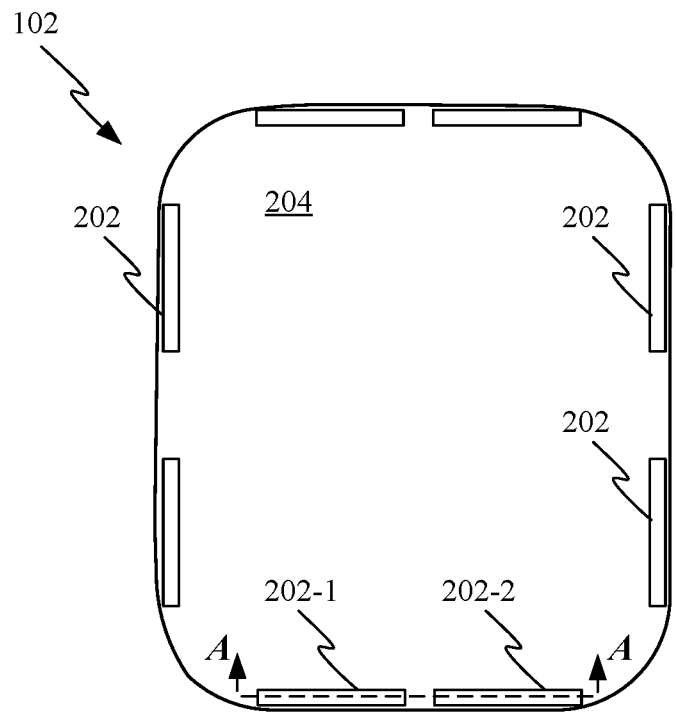
FIG. 2A shows an interior-facing surface of a display assembly of the wearable electronic device depicted in FIG. 1.

FIG. 2A shows an interior-facing surface of display assembly 102. It should be noted that display components and other supporting cables and circuitry have been removed from a central region of display assembly from this view for clarity. FIG. 2A shows how piezoelectric actuators 202 can be distributed around a periphery of a protective cover 204, which can be formed from optically transparent materials such as glass or sapphire material. Piezoelectric actuators 202 expand lengthwise in response to receiving electrical energy. This allows rapid impulses of force to be transmitted by piezoelectric actuators 202. While a total of eight piezoelectric actuators 202 are depicted, it should be appreciated that a larger or smaller number of piezoelectric actuators are possible.

Figure 2B:
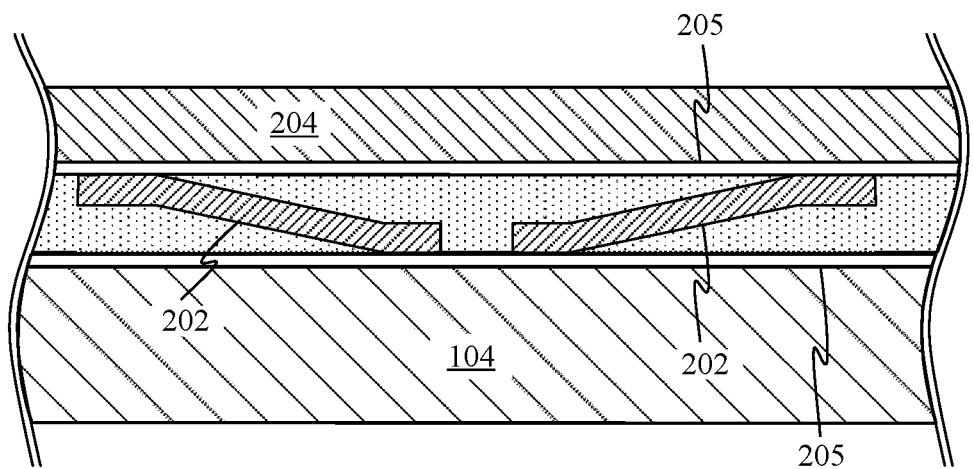
FIG. 2B shows a cross-sectional side view of the display assembly in accordance with section line A-A of FIG. 2A.

FIG. 2B shows a cross-sectional side view of display assembly 102 in accordance with section line A-A. In particular, a possible geometry of piezoelectric actuators 202-1 and 202-2 are shown. Positioning piezoelectric actuators as depicted allows piezoelectric actuators 202-1 and 202-2 to apply both vertical and horizontal forces upon protective cover 204. However, due to the opposing orientations used, when applying voltages that cause both piezoelectric actuators 202-1 and 202-2 to lengthen or shorten the horizontal forces cancel each other out allowing protective cover 204 to vibrate only vertically. This first configuration of forces would work well for audio output. Similarly, applying voltages that cause piezoelectric actuator 202-1 to shrink and 202-2 to lengthen results in the vertical forces cancelling out and the horizontal forces both being exerted to the right. It should be noted that this would also result in the generation of a small amount of rotation due to the horizontal offset between piezoelectric actuators 202-1 and 202-2. This second configuration of forces is preferable for generating waves that are more easily noticeable as haptic vibrations. It should also be noted that piezoelectric actuators 202 are electrically coupled to flexible circuits 205, which provide an electromagnetic pathway along which current can be transmitted. A person with ordinary skill in the art would recognize other methods of electrically coupling piezoelectric actuators 202 to other components within portable electronic device 100.

Figure 2C:
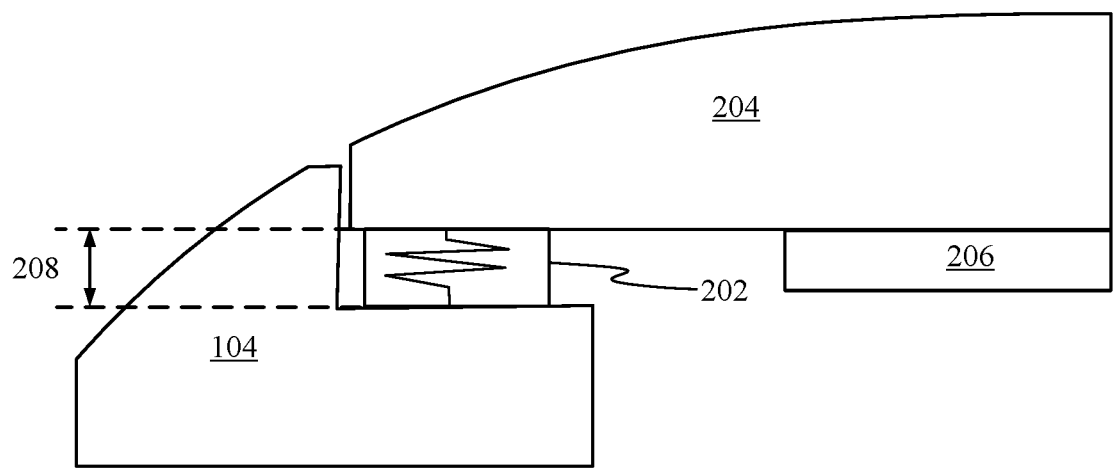
FIG. 2C shows how a piezoelectric actuator can be positioned upon a lip of device housing component 104 and be compressed between protective cover 204 of display assembly 102 and the lip of device housing component 104

FIG. 2C shows how piezoelectric actuator 202 can be positioned upon a lip of device housing component 104 and be compressed between protective cover 204 of display assembly 102 and the lip of device housing component 104. FIG. 2C also shows how display component 206 can be positioned directly under protective cover 204. In some embodiments, a thickness 208 of piezoelectric actuator 202 can be about 0.5 mm; however, the thickness could be between 0.25 mm and 1 mm.

Figure 3:
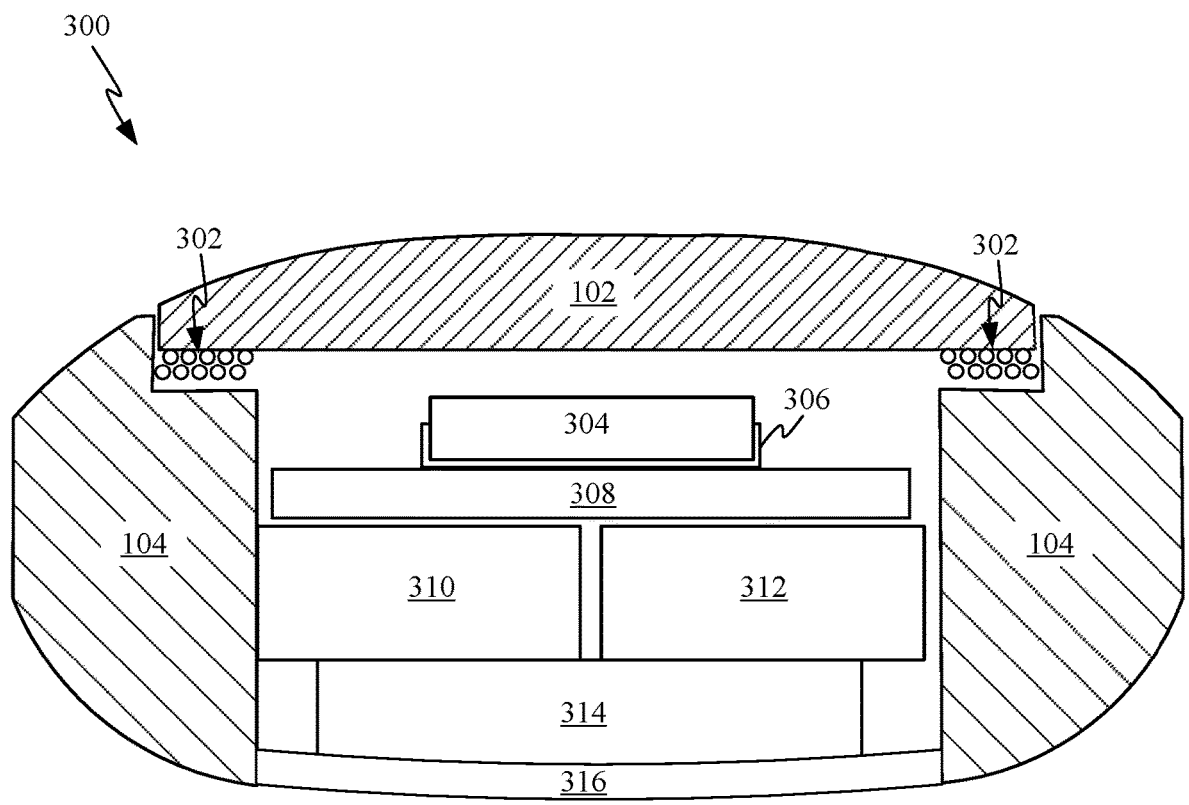
FIG. 3 shows a cross-sectional side view of a wearable electronic device and how a voice coil can be configured to induce vibration of a display assembly of the wearable electronic device.

FIG. 3 shows a cross-sectional side view of wearable electronic device 300 and how a voice coil can be configured to induce vibration of display assembly 102. In particular, an electromagnetic coil 302 of the voice coil is shown positioned along and adhered to a periphery of display assembly 102. A magnetic field generated by electromagnetic coil 302 can be configured to interact with a magnetic field generated by permanent magnet 304 to generate oscillation of display assembly 102. Permanent magnet 304 can include a shunt 306 configured to minimize an amount of electromagnetic interference generated by the magnetic field interacting with printed circuit board 308. Other electrical components within wearable electronic device 300 include battery 310 for powering electronic device 300, haptic engine 312 for providing vibratory feedback to a user of wearable electronic device 300 and sensor assembly 314 for measuring one or more biometric parameters of a user wearing. Wearable electronic device 316 can include a sensor window through which optical and/or radio frequency (RF) signals can pass. This system can also be configured to perform force sensing. For example, when a touch is detected on display assembly 102 and electromagnetic coil is not being used to generate audio waves, any current generated in electromagnetic coil 302 due to movement of electromagnetic coil 302 relative to permanent magnet 304 can be measured and used to determine the amount of force being applied to display assembly 102.

Figure 4:
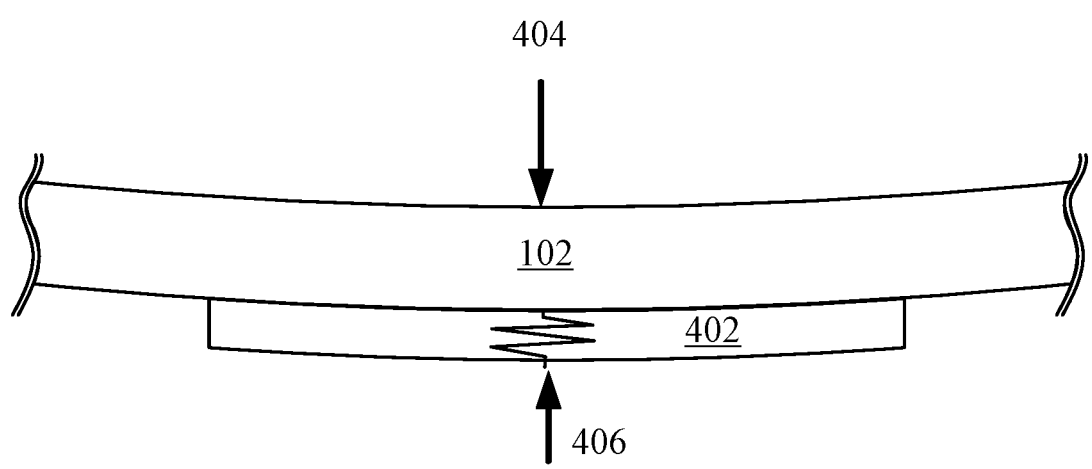
FIG. 4 shows a cross-sectional view of a display assembly with a piezoelectric actuator taking the form of a piezoelectric element adhered to an interior facing surface of the display assembly.

FIG. 4 shows a cross-sectional view of display assembly 102 with a piezoelectric actuator taking the form of a piezoelectric element 402 adhered to an interior facing surface of display assembly 102. When a force 404 is applied to display assembly 102 and bends display assembly 102, this creates a sensible voltage that can be used to register an amount of force applied to display assembly 102. This configuration tends to work better with larger pieces of glass as larger pieces of glass are more prone to bending, whereas a smaller piece of glass might not bend enough to distinguish an amount of force 404 being applied. Similarly, applying an alternating positive or negative voltage 406 to piezoelectric element 402 can induce a localized vibration beneath display assembly 102 by applying shearing forces to display assembly 102. In some embodiments, piezoelectric element 402 can take the form of a piezoelectric sheet or film.

Figure 5A:
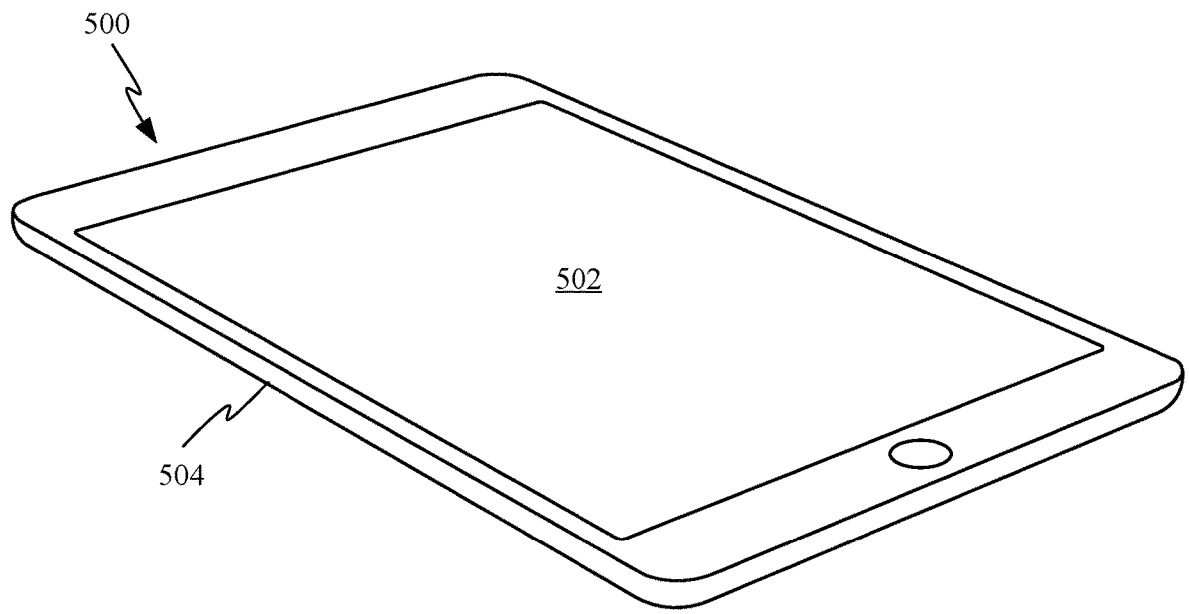
FIG. 5A shows a perspective view of an exemplary tablet device suitable for use with the described embodiments.

FIG. 5A shows a perspective view of an exemplary tablet device 500. Tablet device 500 includes a display assembly 502, which can include a touch sensitive user interface, and a device housing component 504. Display assembly 502 can have a screen size of about 7-12 inches diagonally allowing for the glass making up a protective cover of display assembly 502 to undergo substantial bending in response to user inputs.

Figure 5B:
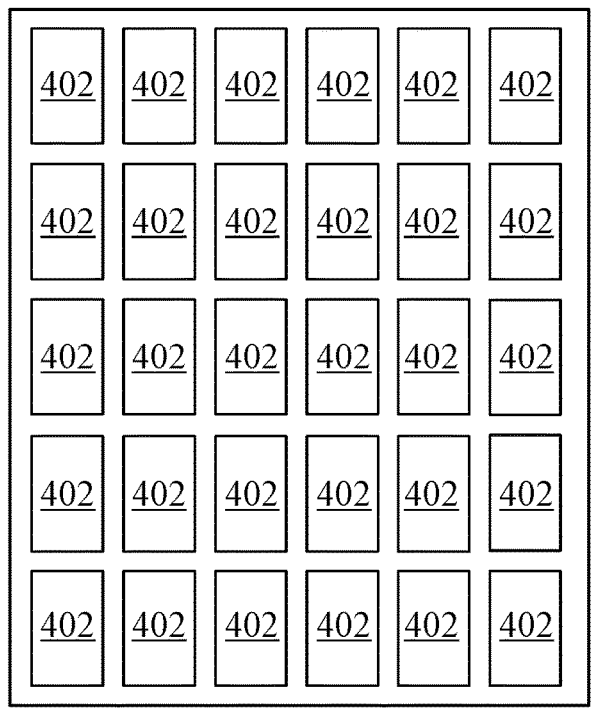
FIG. 5B shows an interior-facing surface of a display assembly of the exemplary tablet device depicted in FIG. 5A.

FIG. 5B shows an interior-facing surface of display assembly 502. The interior-facing surface of display assembly 502 can include an array of piezoelectric elements distributed at a regular interval across the interior-facing surface and configured to measure force inputs and to provide localize haptic feedback or audio output across display assembly 102. The touch sensor allows measurement of a location of each user input and the array of piezoelectric elements allows for an amount of bending experienced across the display assembly 502 to be characterized. In some embodiments, an average voltage could be used to determine force applied; however, the location of the force could be used to normalize the applied force by recognizing that forces applied along a periphery of display assembly 502 would tend to register lower than the same amount of force being applied to a central region of display assembly.

Figure 6:
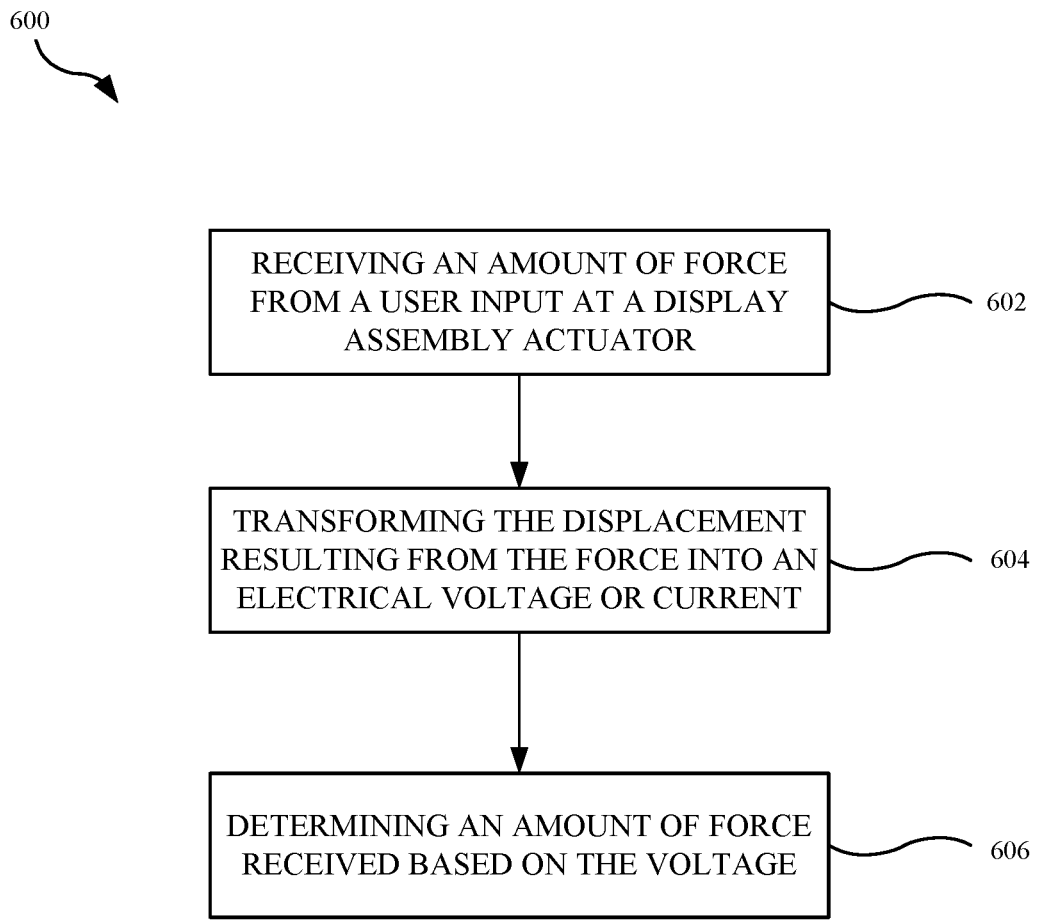
FIG. 6 shows a block diagram illustrating a method for sensing an amount of force received by a graphical user interface of a portable electronic device.

FIG. 6 shows a block diagram illustrating a method for sensing an amount of force received by a display assembly of a portable electronic device displaying a graphical user interface. At 602, an amount of force is received at the display assembly. At 604, the amount of force received results in movement of a protective cover of the display assembly, which induces a voltage or a current in an actuating component coupled to the protective cover. The actuating component can take many forms that include a voice coil motor and one or more piezoelectric actuators. At 606, a processor of the portable electronic device can determine the amount of force received by referencing the voltage or current resulting from movement of the protective cover. In some embodiments, the determination can be made by referencing the current or voltage to a lookup table generated by applying known amounts of force to the display assembly.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data, which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

As described above, one aspect of the present technology is the gathering and use of data available from specific and legitimate sources to improve the delivery to users of invitational content or any other content that may be of interest to them. The present disclosure contemplates that in some instances, this gathered data may include personal information data that uniquely identifies or can be used to identify a specific person. Such personal information data can include demographic data, location-based data, online identifiers, telephone numbers, email addresses, home addresses, data or records relating to a user's health or level of fitness (e.g., vital signs measurements, medication information, exercise information), date of birth, or any other personal information.

The present disclosure recognizes that the use of such personal information data, in the present technology, can be used to the benefit of users. For example, the personal information data can be used to deliver targeted content that may be of greater interest to the user in accordance with their preferences. Accordingly, use of such personal information data enables users to have greater control of the delivered content. Further, other uses for personal information data that benefit the user are also contemplated by the present disclosure. For instance, health and fitness data may be used, in accordance with the user's preferences to provide insights into their general wellness, or may be used as positive feedback to individuals using technology to pursue wellness goals.

The present disclosure contemplates that those entities responsible for the collection, analysis, disclosure, transfer, storage, or other use of such personal information data will comply with well-established privacy policies and/or privacy practices. In particular, such entities would be expected to implement and consistently apply privacy practices that are generally recognized as meeting or exceeding industry or governmental requirements for maintaining the privacy of users. Such information regarding the use of personal data should be prominent and easily accessible by users, and should be updated as the collection and/or use of data changes. Personal information from users should be collected for legitimate uses only. Further, such collection/sharing should occur only after receiving the consent of the users or other legitimate basis specified in applicable law. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations that may serve to impose a higher standard. For instance, in the US, collection of or access to certain health data may be governed by federal and/or state laws, such as the Health Insurance Portability and Accountability Act (HIPAA); whereas health data in other countries may be subject to other regulations and policies and should be handled accordingly.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, users can select not to provide mood-associated data for targeted content delivery services. In yet another example, users can select to limit the length of time mood-associated data is maintained or entirely block the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing identifiers, controlling the amount or specificity of data stored (e.g., collecting location data at city level rather than at an address level), controlling how data is stored (e.g., aggregating data across users), and/or other methods such as differential privacy.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users based on aggregated non-personal information data or a bare minimum amount of personal information, such as the content being handled only on the user's device or other non-personal information available to the content delivery services

What is claimed is:

1. A portable electronic device, comprising:
    a device housing component having a lip defining a front opening, the lip having a continuous and flat surface extending around the periphery of the front opening;
    a display assembly covering the front opening and cooperating with the device housing component to define an interior volume, the display assembly comprising:
        a protective cover having a central region and a peripheral region; and
        a display coupled directly under the central region; and
    first and second piezoelectric actuators positioned on the surface of the lip of the device housing component and compressed between the peripheral region of the protective cover and the surface of the lip of the device housing component, each of the piezoelectric actuators being configured to apply a force input to the protective cover, the force inputs having a horizontal force component and a vertical force component, and
    wherein the first and second piezoelectric actuators are oriented such that the horizontal force components are generated in opposing directions and the vertical force components are generated in opposing directions and applying voltage on the first and second piezoelectric actuators: (i) cancels out the horizontal force components allowing the protective cover to vibrate only vertically or (ii) cancels out the vertical force components allowing the protective cover to vibrate only horizontally.

2. The portable electronic device as recited in claim 1, further comprising a plurality of piezoelectric actuators.

3. The portable electronic device as recited in claim 1, wherein the piezoelectric actuator is configured to measure an amount of force applied to the display assembly by a user input.

4. The portable electronic device as recited in claim 1, wherein the protective cover is formed from a material selected from a group consisting of glass and sapphire.

5. The portable electronic device as recited in claim 1, wherein the input is applied in a direction orthogonal to an interior facing surface of the protective cover.

6. The portable electronic device as recited in claim 1, wherein the portable electronic device is a smart watch.

7. The portable electronic device as recited in claim 1, wherein the piezoelectric actuator is configured to compress between the peripheral region of the protective cover and the surface of the lip of the device housing component in response to an amount of force applied to the display assembly by a user input.

8. A portable electronic device, comprising:
    a device housing component having a lip defining a front opening, the lip having a continuous and flat surface extending around the periphery of the front opening;
    a display assembly coupled to the device housing component, the display assembly comprising a protective cover and a display coupled directly under a central region of the protective cover; and
    first and second actuators configured to apply a vibratory input to the display assembly, the actuator positioned on the surface of the lip of the device housing component and compressed between the surface of the lip and the protective cover of the display assembly, each of the actuators being configured to apply a force input to the protective cover, the force inputs having a horizontal force component and a vertical force component, and
    wherein the first and second actuators are oriented such that the horizontal force components are generated in opposing directions and the vertical force components are generated in opposing directions and applying voltage on the first and second actuators: (i) cancels out the horizontal force components allowing the protective cover to vibrate only vertically or (ii) cancels out the vertical force components allowing the protective to vibrate only horizontally.

9. The portable electronic device as recited in claim 8, wherein the actuator comprises a plurality of piezoelectric actuators.

10. The portable electronic device as recited in claim 9, wherein the plurality of piezoelectric actuators are distributed around the lip.

11. The portable electronic device as recited in claim 8, wherein the actuator is a voice coil motor comprising a permanent magnet and an electromagnetic coil.

12. A portable electronic device, comprising:
a device housing component having a lip defining a front opening, the lip having a continuous and flat surface extending around the periphery of the front opening;
a display assembly coupled to the device housing component, the display assembly comprising a protective cover and a display coupled directly under a central region of the protective cover; and
an array of piezoelectric actuators positioned on the surface of the lip of the device housing component and compressed between the surface of the lip and an interior facing surface of the display assembly and being configured to apply a vibratory input to the display assembly, each of the piezoelectric actuators being configured to apply a force input to the protective cover, the force inputs having a horizontal force component and a vertical force component,
wherein two piezoelectric actuators of the array of piezoelectric actuators are oriented such that the horizontal force components are generated in opposing directions and the vertical force components are generated in opposing directions and applying voltage on the two piezoelectric actuators: (i) cancels out the horizontal force components allowing the protective cover to vibrate only vertically or (ii) cancels out the vertical force components allowing the protective cover to vibrate only horizontally.

13. The portable electronic device as recited in claim 12, wherein the array of piezoelectric actuators are configured to apply the vibratory input to the display assembly with a subset of the piezoelectric actuators of the array or piezoelectric actuators.

14. The portable electronic device as recited in claim 12, wherein a first piezoelectric actuator of the array of piezoelectric actuators is configured to apply the vibratory input to the display assembly and a second piezoelectric actuator of the array of piezoelectric actuators is configured to measure an amount of force applied by user inputs received at the display assembly.

15. The portable electronic device as recited in claim 12, wherein each piezoelectric actuator of the array of piezoelectric actuators is configured to apply the vibratory input and the vibratory input has both vertical and horizontal components relative to an interior facing surface of the protective cover.

16. The portable electronic device as recited in claim 12, wherein the vibratory input reproduces audio output.

17. The portable electronic device as recited in claim 12, wherein the array of piezoelectric actuators are arranged in a grid along the interior facing surface of the display assembly.

18. The portable electronic device as recited in claim 12, wherein the vibratory input is applied in a direction horizontal to an interior surface of the protective cover.

19. The portable electronic device as recited in claim 12, wherein the portable electronic device is configured to determine an amount of force applied to the display assembly by a user input using the array of piezoelectric actuators.

* * * * *

UNITED STATES PATENT AND TRADEMARK OFFICE
CERTIFICATE OF CORRECTION

PATENT NO. : 11,188,151 B2  
APPLICATION NO. : 16/292927  
DATED : November 30, 2021  
INVENTOR(S) : Tyler S. Bushnell et al.

Page 1 of 1

It is certified that error appears in the above-identified patent and that said Letters Patent is hereby corrected as shown below:

In the Claims

Claim 8, Column 9, Line 6, delete "allowing the protective to" and insert --allowing the protective cover to--

Signed and Sealed this  
Twenty-second Day of February, 2022

Drew Hirshfeld  
*Performing the Functions and Duties of the*  
*Under Secretary of Commerce for Intellectual Property and*  
*Director of the United States Patent and Trademark Office*